United States Patent
Venkataraman et al.

(10) Patent No.: US 7,911,256 B2
(45) Date of Patent: Mar. 22, 2011

(54) DUAL INTEGRATOR CIRCUIT FOR ANALOG FRONT END (AFE)

(75) Inventors: Jagannathan Venkataraman, Bangalore (IN); Vajeed Nimran, Bangalore (IN); Sandeep Oswal, Bangalore (IN); Visveswaraya Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/541,165

(22) Filed: Aug. 14, 2009

(65) Prior Publication Data

US 2010/0052741 A1 Mar. 4, 2010

Related U.S. Application Data

(60) Provisional application No. 61/091,921, filed on Aug. 26, 2008, provisional application No. 61/096,898, filed on Sep. 15, 2008.

(51) Int. Cl.
*H03K 5/00* (2006.01)

(52) U.S. Cl. .......................... 327/337; 327/554; 327/515

(58) Field of Classification Search .......... 327/336–337, 327/339, 341–344, 514–515, 551–559
See application file for complete search history.

(56) References Cited

U.S. PATENT DOCUMENTS

| 6,606,123 B2 * | 8/2003 | Mizuno | 348/308 |
| 7,507,947 B2 * | 3/2009 | Bamji et al. | 250/214 A |

\* cited by examiner

*Primary Examiner* — Dinh T. Le
(74) *Attorney, Agent, or Firm* — Steven A. Shaw; W. James Brady; Frederick J. Telecky, Jr.

(57) ABSTRACT

A circuit includes a generating circuit that generates a current signal in response to an input signal, a first one of a plurality of integrators that generates a voltage signal from the current signal, a comparator that is responsive to the voltage signal to compare the voltage signal with a predefined voltage, a switching circuit that reconfigures a first capacitor and a second capacitor connected to the first one of the plurality of integrators to discharge the first capacitor and to enable the second capacitor to generate the voltage signal in response to the current signal, and an analog-to-digital converter to generate an output when a predefined time interval has elapsed. The output is obtained by adding a first charge value corresponding to a count of number of times the voltage signal reaches the predefined voltage in the predefined time interval and a second charge value from the analog-to-digital converter.

17 Claims, 9 Drawing Sheets

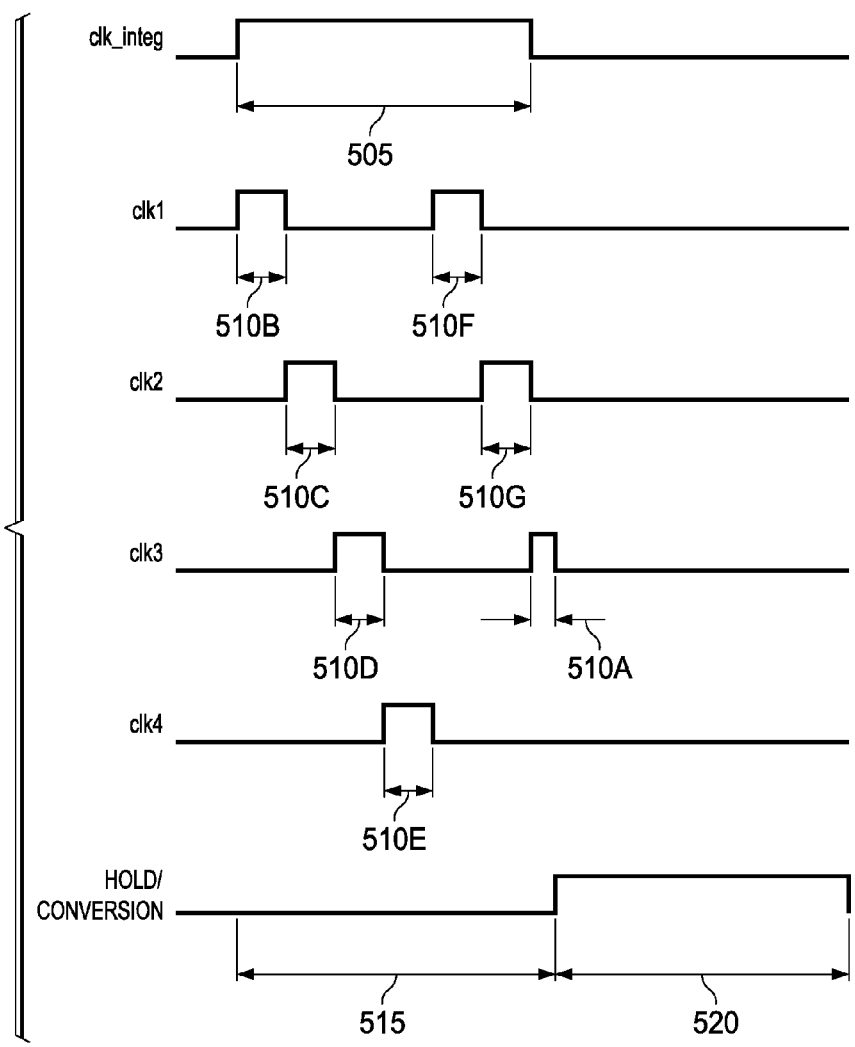

DUAL INTEGRATOR CIRCUIT FOR ANALOG FRONT END (AFE)

REFERENCE TO PRIORITY APPLICATION

This application claims priority from U.S. Provisional Application Ser. No. 61/091,921 filed Aug. 26, 2008, entitled "Front end architecture for CT system" and from U.S. Provisional Application No. 61/096,898, filed Sep. 15, 2008, entitled "Low power front end architecture for CT system", naming Texas Instruments Incorporated (the intended assignee) as the Applicant, and naming the same inventors as in the present application as inventors, which are incorporated herein by reference in entirety.

TECHNICAL FIELD

Embodiments of the disclosure relate to dual integrator circuits for an analog front end (AFE).

BACKGROUND

In various applications, for example a computed tomography application, an analog front end (AFE) is used to obtain digital data from analog data. The AFE includes a generating circuit. The generating circuit requires support circuitry. Often, the support circuitry consumes power, and area, produces high noise which in turn limits the performance of computed tomography application. Further, designing the support circuitry requires high cost. One such support circuitry is shown in FIG. 1 (Prior Art).

A dual integrator circuit for a generating circuit in an AFE as illustrated in FIG. 1 (Prior Art) provides digital data from an analog signal from the generating circuit. The dual integrator circuit requires lower area and less power consumption than other existing techniques. The dual integrator circuit provides a digitized charge value in response to a signal from the generating circuit when the generating circuit is struck by an X-ray beam. More particularly, the generating circuit, for example a photo detector 105, generates a current signal in response to the X-ray beam. The current signal is provided to an integrator circuit 110A when a switch 115A is active. The integrator circuit 110A generates an output voltage at a node 120A. The output voltage can be realized using a capacitor 125A. The output voltage is provided to a switched capacitor sigma delta (SCSD) modulator 130 to generate a digitized charge value. The digitized charge value represents a measured fraction of the X-ray beam. Similarly, an output voltage can be generated by an integrator circuit 110B when a switch 115B is active which can then be converted to a digital value. Noise introduced by each integrator circuit is given by the formula $K*T*C$, where C is capacitance of the capacitor 125A or 125B, K is a constant and T is temperature. It is also desired to support high current signal in order to get maximum digitized charge value. Maximum current signal that can be supported is given by $(C*V)/t$ where, V is the output voltage, and t is time. The conditions for supporting low noise and maximum current signal are conflicting as for having low noise a low capacitance value is desired and for supporting high current signal a high capacitance value is desired. Further, it is also desired to minimize power burnt in each integrator circuit due to loads, for example a capacitor 125C and a capacitor 125D of the SCSD modulator 130.

SUMMARY

Embodiments of the disclosure relate to dual integrator circuit for an Analog Front End (AFE).

An example of a circuit includes a generating circuit that detects an input signal and generates a current signal. The circuit also includes a plurality of integrators coupled to the generating circuit. A first one of the plurality of integrators is responsive to the current signal to generate a voltage signal. Further, the circuit includes a comparator that is responsive to the voltage signal to compare the voltage signal with a predefined voltage. Furthermore, the circuit includes a first switching circuit that is coupled to the comparator. The first switching circuit inactivates the first one of the plurality of integrators and activates a second one of the plurality of integrators when a predefined criterion is met. The circuit also includes an analog-to-digital converter that is coupled to the plurality of integrators. The analog-to-digital converter generates an output from the voltage signal when the predefined criterion is met.

An example of a method includes generating a voltage signal in response to an input signal. The method further includes comparing the voltage signal with a predefined voltage. The method also includes resetting the voltage signal when the voltage signal reaches the predefined voltage. Moreover, the method includes counting number of times the voltage signal reaches the predefined voltage over a predefined time interval. The method further includes obtaining an output from the voltage signal after the predefined time interval has elapsed.

Another example of a method includes generating a first voltage signal in response to an input signal. The method also includes comparing the first voltage signal with a predefined voltage. Further, the method includes simultaneously converting the first voltage signal into a charge value when the first voltage signal reaches the predefined voltage and generating a second voltage signal in response to the input signal.

BRIEF DESCRIPTION OF THE VIEWS OF DRAWINGS

FIGS. 5A, 5B, 5C, 5D, 5E and 5F illustrate working of a portion of a switching circuit for an integrator circuit in accordance with one embodiment;

DETAILED DESCRIPTION OF THE EMBODIMENTS

Figure 1:
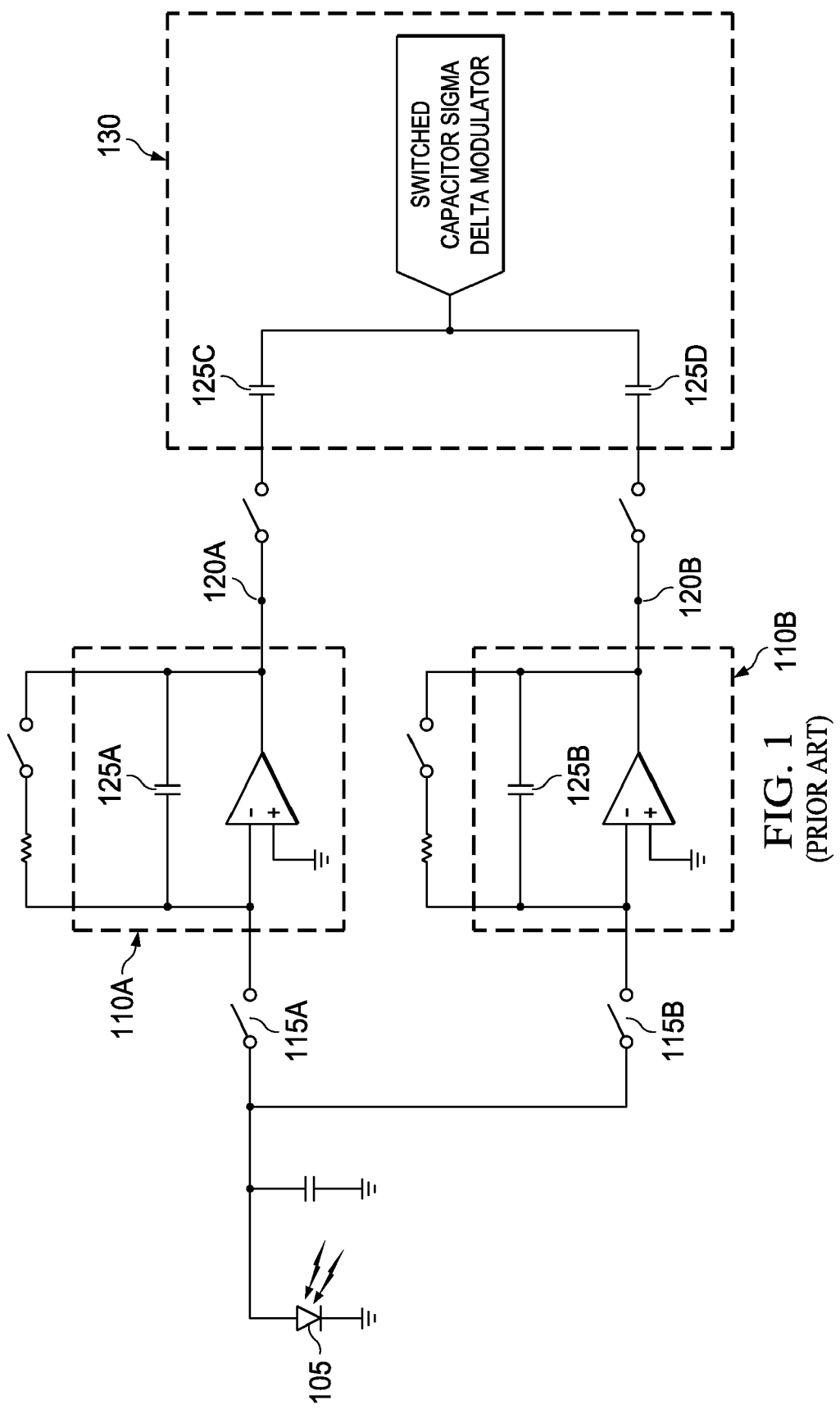
FIG. 1 is a dual integrator circuit for a computed tomography (CT) application in accordance with the prior art.
Figure 2:
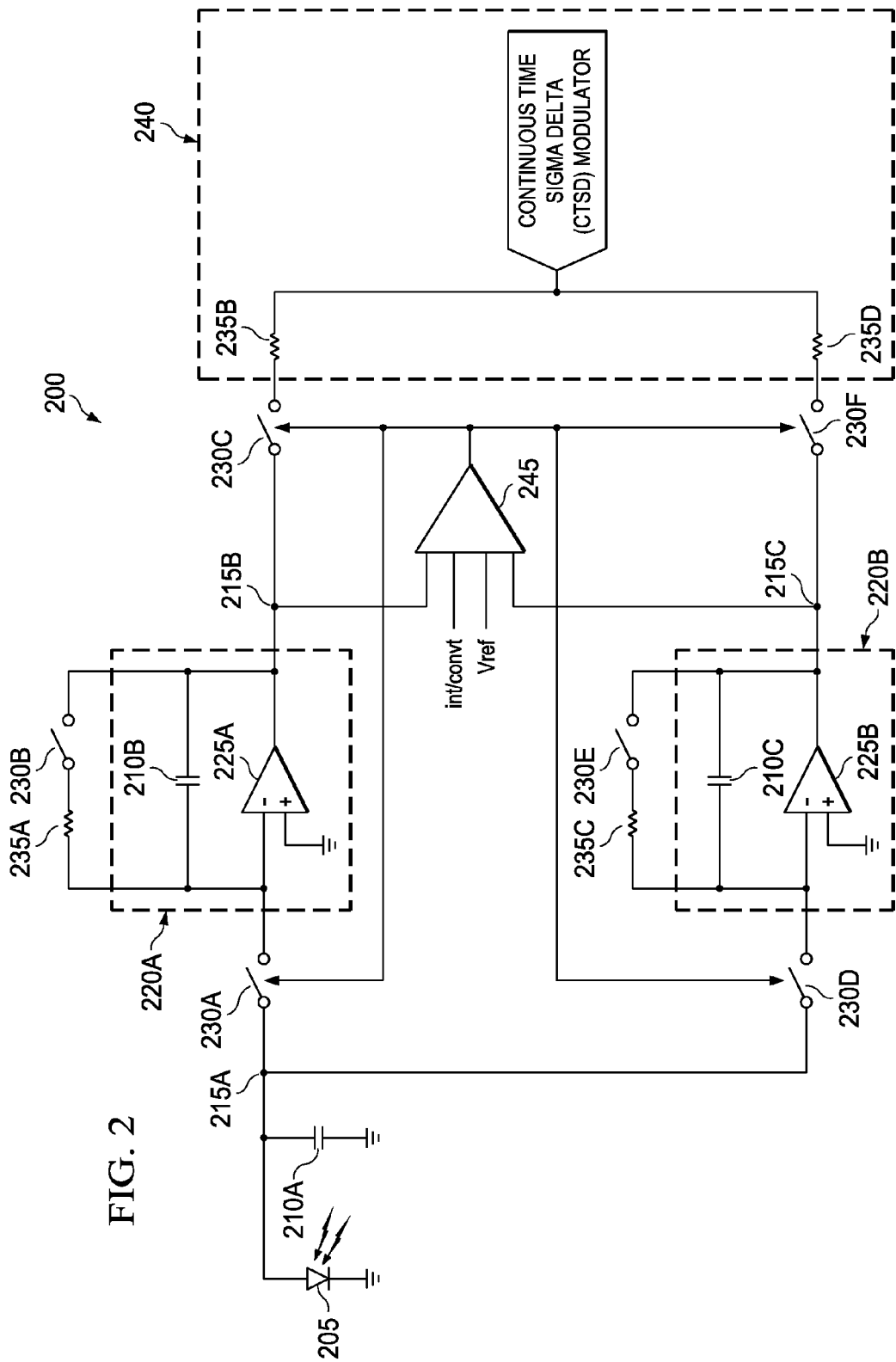
FIG. 2 illustrates an Analog Front End (AFE) in accordance with one embodiment.

Referring to FIG. 2, the AFE 200 includes a generating circuit, for example a photodiode 205, a transducer or a photodetector. A capacitor 210A is a part of the photodiode 205 and capacitance of the capacitor 210A can be referred to as capacitance of the photodiode 205. One terminal of the photodiode 205 is coupled to a node 215A, and other terminal is connected to ground. The AFE 200 also a plurality of integrator circuits, for example an integrator circuit 220A and an integrator circuit 220B coupled to the node 215A. A negative input of an operational amplifier 225A is coupled to the node 215A through a switch 230A. A positive input of the operational amplifier 225A is grounded. An output of the operational amplifier 225A is connected to a node 215B. A capacitor 210B is connected between the negative input and the output of the operational amplifier 225A. The operational amplifier 225A and the capacitor 210B together define the integrator circuit 220A. A series combination of a resistor 235A and a switch 230B is also connected between the negative input and the output of the operational amplifier 225A.

A resistor 235B is included in an analog-to-digital converter, for example a continuous time sigma delta (CTSD) modulator 240 and coupled to a switch 230C. The switch 230C is coupled to the node 215A. A negative input of an operational amplifier 225B is connected to the node 215A through a switch 230D. A positive input of the operational amplifier 225B is grounded. An output of the operational amplifier 225B is connected to a node 215C. A capacitor 210C is connected between the negative input and the output of the operational amplifier 225B. The operational amplifier 225B and the capacitor 210C together define the integrator circuit 220B. A series combination of a resistor 235C and a switch 230E is also connected between the negative input and the output of the operational amplifier 225B. A resistor 235D is included in the CTSD modulator 240 and coupled to a switch 230F. The switch 230F is coupled to the node 215C.

The capacitor 210B and the capacitor 210C can be referred to as a first capacitor of the integrator circuit 220A and a first capacitor of the integrator circuit 220B respectively. The AFE 200 also includes a comparator 245. One input terminal of the comparator 245 is coupled to the node 215B and another input terminal to the node 215C. The comparator 245 also has at least one other input terminal. The other input terminals include a first input terminal receiving a first input and a second input terminal receiving a second input. The first input (VREF) can be a predefined voltage and can be received from a voltage supply. The second input (int/convt) can be a predefined time interval and can be received from a clock supply. The predefined voltage can be defined as maximum swing voltage that can be generated by the integrator circuit 220A or the integrator circuit 220B. An output node of the comparator 245 is coupled to the switch 230A, the switch 230C, the switch 230D, and the switch 230F.

The switch 230A and the switch 230D can together be referred to as a first switching circuit. The switch 230C and the switch 230F can together be referred to as a second switching circuit.

It is noted that various existing architecture of switches can be used.

The AFE 200 is used in various applications, for example in computed tomography application, X-ray, and spectroscopy. The AFE 200 provides a digitized charge value at output of the CTSD modulator 240 in response to an input signal, for example, the input signal is an X-ray beam. The photodiode 205 generates a current signal at the node 215A in response to the input signal. The input signal is provided to the integrator circuit 220A when the switch 230A is active and is provided to the integrator circuit 220B when the switch 230D is active.

In one example, the switch 230A is active. The integrator circuit 220A integrates the current signal to generate a voltage signal at the node 215B. The comparator 245 is responsive to the voltage signal and other inputs to generate a comparator output. For example, the comparator 245 compares the voltage signal with the predefined voltage and generates the comparator output indicating that the voltage signal has reached the predefined voltage. The integration continues till the voltage signal reaches the predefined voltage. A first cycle of integration completes when the voltage signal reaches the predefined voltage. The first switching circuit coupled to the comparator 245, inactivates the integrator circuit 220A and activates the integrator circuit 220B based on the comparator output. The current signal is then provided to the integrator circuit 220B to start a second cycle of integration.

The comparator 245 also activates the switch 230C and the voltage signal is provided to the CTSD modulator 240. The CTSD modulator 240 generates a charge value from the voltage signal. The charge value can be referred to as the output. The generation of the charge value happens in parallel to the second cycle of integration and can be referred to as a first cycle of conversion of the voltage signal into the charge value. The CTSD modulator 240 is driven by the integrator circuit 220A during the first cycle of conversion. The power burnt in the integrator circuit 220A during the first cycle of conversion is less, as the load to the integrator is a resistor 235B of the CTSD modulator 240, as compared to a switched capacitor sigma delta (SCSD) modulator where a capacitor acts as the load. Also, the power burnt in the CTSD modulator 240 is lower than the SCSD modulator for similar speed and performance.

Further, the first cycle of conversion can have a threshold time t within which the CTSD modulator 240 generates the charge value. The threshold time t can be calculated as $t=(VREF*C)/IMAX$, where C is the capacitance of the capacitor 210B,
VREF is the predefined voltage, and
IMAX is maximum value of the current signal.

The capacitance of the capacitor 210B and of the capacitor 210C is low to minimize noise. The noise (N) can be calculated for the first cycle of integration as $N=K*T*C$, where K is a constant.

The AFE 200 generates several digitized charge values to complete the conversion of the analog data into the digital data. The digitized charge values are representative of the digital data. The generation can be performed for a predefined time interval in which several cycles of integration and several cycles of conversion can be performed. The predefined time interval can be defined as time required for integrating the current signal. Operating frequency of the CTSD modulator 240 needs to be high to meet the threshold time t. The operating frequency requirement of the CTSD modulator 240 can be optimized by performing a single conversion at the end of the predefined integration time. An AFE 300 for providing the digital data by performing the single conversion is explained in conjunction with FIG. 3.

Figure 3:
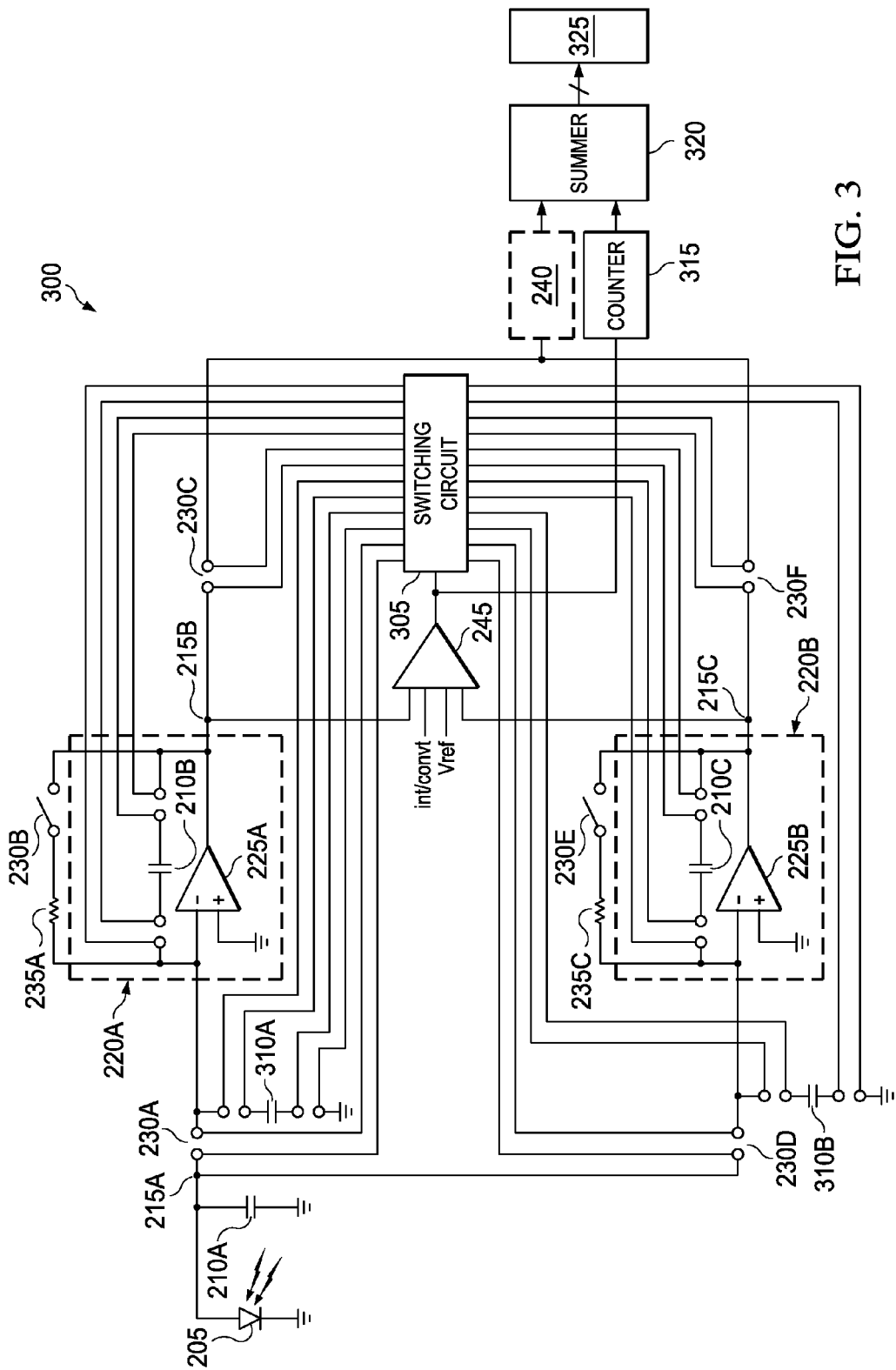
FIG. 3 illustrates an AFE in accordance with another embodiment.

Referring to FIG. 3, the AFE 300 includes a third switching circuit 305, hereinafter referred to as the switching circuit 305. The switching circuit 305 is coupled to the integrator circuit 220A, the integrator circuit 220B, a capacitor 310A and a capacitor 310B. The capacitor 310A and the capacitor 310B can be referred to as a second capacitor of the integrator circuit 220A and a second capacitor of the integrator circuit 220B respectively. The switching circuit 305 is also coupled to the comparator 245 to receive control signals. The switching circuit 305 includes a plurality of switches controlled by the control signals.

The AFE 300 also includes a counter 315 coupled to the comparator 245 to count number of times the voltage signal generated by, for example, the integrator circuit 220A reaches the predefined voltage over the predefined time interval. Whenever the voltage signal reaches the predefined voltage, the switching circuit 305 reconfigures the capacitor 310A and the capacitor 310B to discharge the capacitor 310A and to enable the capacitor 310B to generate the voltage signal in response to the current signal. The switching circuit 305 flips terminals of the capacitor 310A and connects the capacitor 310A with flipped terminals at place of the capacitor 210B. The switching circuit also connects the capacitor 210B at place of the capacitor 310A. The AFE 300 also includes a summer 320 with one terminal coupled to the CTSD modulator 240 and another terminal coupled to the counter 315. After the predefined time interval has elapsed an output is obtained from the voltage signal. The comparator 245, in response to the second input, generates the comparator output indicating that the predefined time interval has elapsed. The integrator circuit 220A is inactivated in response to the comparator output and the integrator circuit 220B is activated.

In each count the voltage signal falls from VREF to −VREF. A charge value for each count can be determined as 2*VREF*C. The charge value for each count can be summed to yield a first charge value. The AFE 300 prevents any glitch at the node 215A by enabling flipping of the capacitors and connecting to node 215A to subtract a predefined amount of charge from the capacitor 210B. Prevention of glitch prevents the photodiode 205 from exiting linear operating region.

In some embodiments, it might happen that the predefined time interval elapses after the last count but before the output voltage signal at the node 215B reaches the predefined voltage. In such a case the voltage signal generated at the node 215B, after the last count, is converted to a second charge value by the CTSD modulator 240. The summer 320 sums the first charge value and the second charge value, and outputs digital equivalent of the sum.

Figure 4:
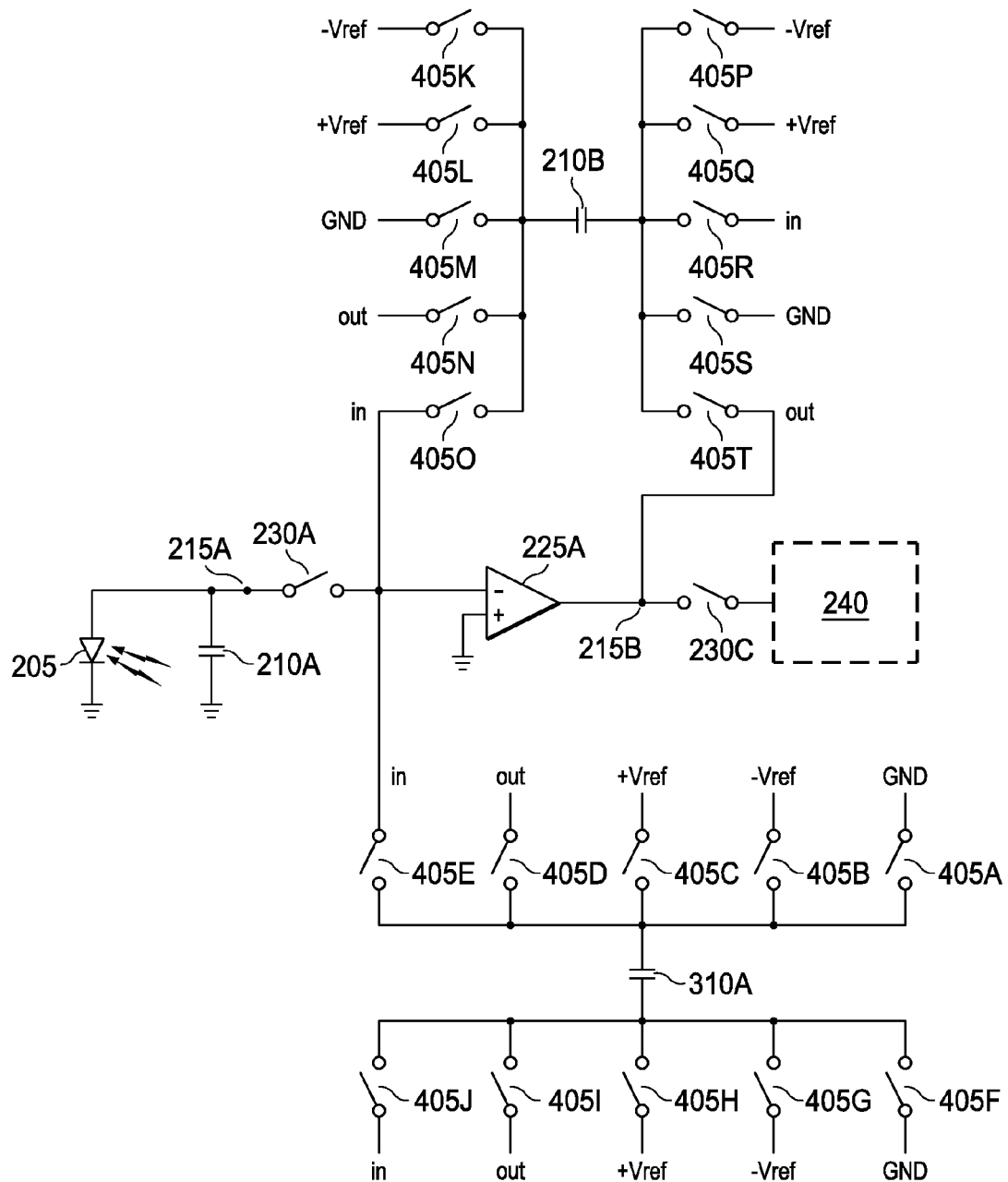
FIG. 4 illustrates a portion of switching circuit for an integrator circuit in accordance with one embodiment.

A portion of the switching circuit 305 is explained in conjunction with the integrator circuit 220A and the capacitor 310A in FIG. 4.

Referring to FIG. 4, a portion 400 of the switching circuit 305 includes a switch 405A, a switch 405B, a switch 405C, a switch 405D, a switch 405E, a switch 405F, a switch 405G, a switch 405H, a switch 405I and a switch 405J having one terminal coupled to the capacitor 310A. The portion 400 also includes a switch 405K, a switch 405L, a switch 405M, a switch 405N, a switch 405O, a switch 405P, a switch 405Q, a switch 405R, a switch 405S and a switch 405T having one terminal coupled to the capacitor 210B. Another terminal of each of the switch 405A, the switch 405F, the switch 405M and the switch 405S is coupled to the ground. Another terminal of each of the switch 405B, the switch 405G, the switch 405K and the switch 405P is coupled to a first supply. The first supply has magnitude equal to the predefined voltage and has a negative polarity. Another terminal of each of the switch 405C, the switch 405H, the switch 405L and the switch 405Q is coupled to a second supply. The second supply has magnitude equal to the predefined voltage and has a positive polarity. Another terminal of each of the switch 405D, the switch 405I, the switch 405N and the switch 405T is coupled to the node 215B. Another terminal of each of the switch 405E, the switch 405J, the switch 405O and the switch 405R is coupled to the node 215A.

Each switch can be a programmable switch. The switches can be controlled, for example by using control signals generated by the comparator 225A.

In one embodiment, the portion 400 can also be coupled to the integrator circuit 220B. In another embodiment, a portion similar to the portion 400 can be present for the integrator circuit 220B.

In some embodiments, instead of using the switching circuit 305 a predefined amount of charge can be subtracted from the capacitor 210B whenever the voltage signal reaches the predefined voltage. The predefined amount of charge can be subtracted by connecting the capacitor 310 at the node 215B. The capacitor 310A discharges the capacitor 210B when the voltage signal reaches the predefined voltage. The switch 405G can also be present to charge the capacitor using the first supply.

It is noted that various techniques can be used for reconfiguring the capacitor 310A and the capacitor 310B to subtract the predefined amount of charge.

The working of the portion 400 is explained in detail in conjunction with FIGS. 5A, 5B, 5C, 5D, 5E and 5F.

FIG. 5A illustrates exemplary clock phases. Clock signals can be generated using control signals from a comparator, for example the comparator 245. Control signals for the switches can be generated from the clock signals.

The predefined time interval 505 is an integration time period of the integrator circuit 220A. The predefined time interval 505 can be divided into several integration phases using one or more clocks. Each integration phase is equivalent to the time required by the voltage signal generated by the integrator circuit 220A to reach the predefined voltage. Each integration phase corresponds to a count.

In the illustrated example, the predefined time interval 505 is of 100 milliseconds (ms). Each integration phase is of 16 ms except an integration phase 510A which is of 4 ms. An integration phase 510G corresponds to the last count. The integration phase 510A occurs subsequent to the last count and can be referred to as a partial count. In the integration phase 510A the voltage signal at the node 215B does not reach the predefined voltage. However, the integration circuit 220A becomes inactive as the predefined time interval 505 has elapsed.

In an integration phase 510B and an integration phase 510F the switch 405O, the switch 405T, the switch 405E and the switch 405G are active. All other switches of the portion 400 are inactive.

In an integration phase 510C and an integration phase 510G the switch 405O, the switch 405P, the switch 405D and the switch 405J are active. All other switches of the portion 400 are inactive.

In an integration phase 510D and an integration phase 510A the switch 405N, the switch 405R, the switch 405B and the switch 405J are active. All other switches of the portion 400 are inactive.

In an integration phase 510E the switch 405K, the switch 405P, the switch 405E and the switch 405I are active. All other switches of the portion 400 are inactive.

At the end of each integration phase, except the integration phase 510A, the capacitor 210B and the capacitor 310 are swapped, and the capacitor which is not coupled in parallel to the integrator circuit 220A is flipped before the swapping using the switches (405A to 405T).

The predefined time interval 505 is equal to a hold time interval 515. The CTSD modulator 240 is inactive during the hold time interval 515. The voltage signal is generated in each integration phase and a charge value is obtained for each integration phase. A first charge value is then determined during a conversion time interval 520. The first charge value is a sum of charge values obtained in each integration phase.

The CTSD modulator 240 also generates a second charge value from the voltage signal generated during the integration phase 510A. The first charge value and the second charge value are summed and outputted. The integrator circuit 220A becomes inactive in a conversion time interval 520 and other integrator circuit of the dual integrator circuit becomes active. The switch 405N, the switch 405R, the switch 405E and the switch 405I are active. All other switches of the portion 400 are inactive. The switch 225C is also active.

Figure 5B:
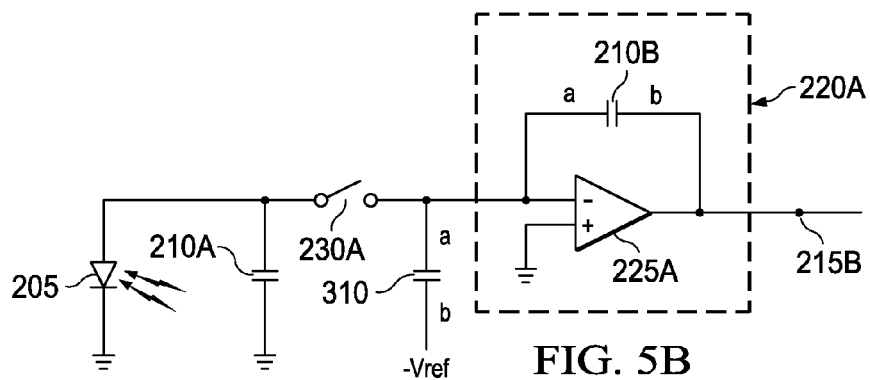

FIG. 5B illustrates connections of the capacitor 210B and the capacitor 310 in the integration phase 510B and the integration phase 510F. Initially the charge in the capacitor 210B is 1*C2 and in the capacitor 310 is −1*C1, where C2 is the capacitance value of the capacitor 210B and C1 is the capacitance value of the capacitor 310.

In one embodiment, during the integration phase 510B the voltage signal at the node 215B falls from 1 V to −1V. At the end of the integration phase 510B the voltage signal is equal to −1 V. At the end of the integration phase 510B the charge in the capacitor 210B is 1*C2 +1*C2=(2*C2) and in the capacitor 310 is −1*C1. The predefined voltage is −1 volt (V).

In another embodiment, during the integration phase 510B voltage signal at the node 215B falls from 1 V to −1V. At the end of the integration phase 510B the voltage signal is greater than −1 V. This can be due to an offset VOFF of the comparator 245. At the end of the integration phase 510B the voltage signal has a magnitude of −1+VOFF, the charge in the capacitor 210B is (2−VOFF)*C2, and the charge in the capacitor 310 is −1*C1.

The capacitor 310 is then flipped and coupled at the place of the capacitor 210B, and the capacitor 210B is placed at the place of the capacitor 310 at the end of the integration phase 510B. One terminal of the capacitor 210B is forced to −1 V and the charge of −VOFF*C2 gets stored in the capacitor 310. The leftover charge −VOFF*C2 from the integration phase 510B is carried over to the integration phase 510C. The leftover charge may then change in the integration phase 510C and is carried over to the integration phase 510D and so on. At the end of the predefined time interval 505 the leftover charge is added to the charge value from the integration phase 510A and converted into digital value to yield the second charge value.

Figure 5C:
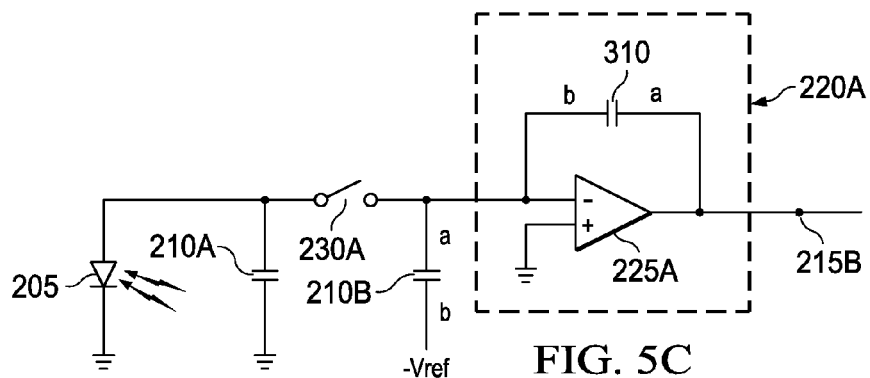

FIG. 5C illustrates connections of the capacitor 210B and the capacitor 310 in the integration phase 510C and the integration phase 510G.

Figure 5D:
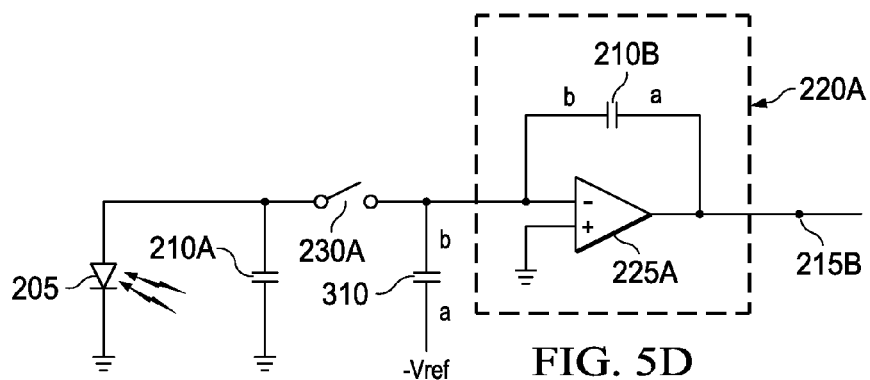

FIG. 5D illustrates connections of the capacitor 210B and the capacitor 310 in the integration phase 510C and the integration phase 510A.

Figure 5E:
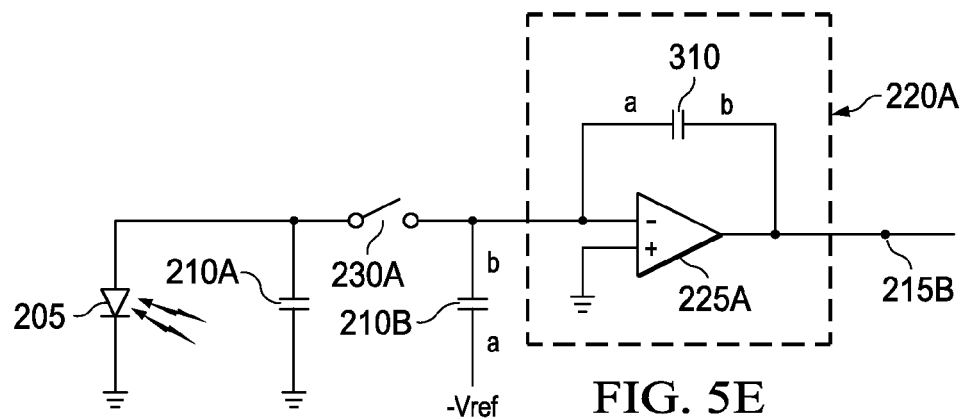

FIG. 5E illustrates connections of the capacitor 210B and the capacitor 310 in the integration phase 510D.

Figure 5F:
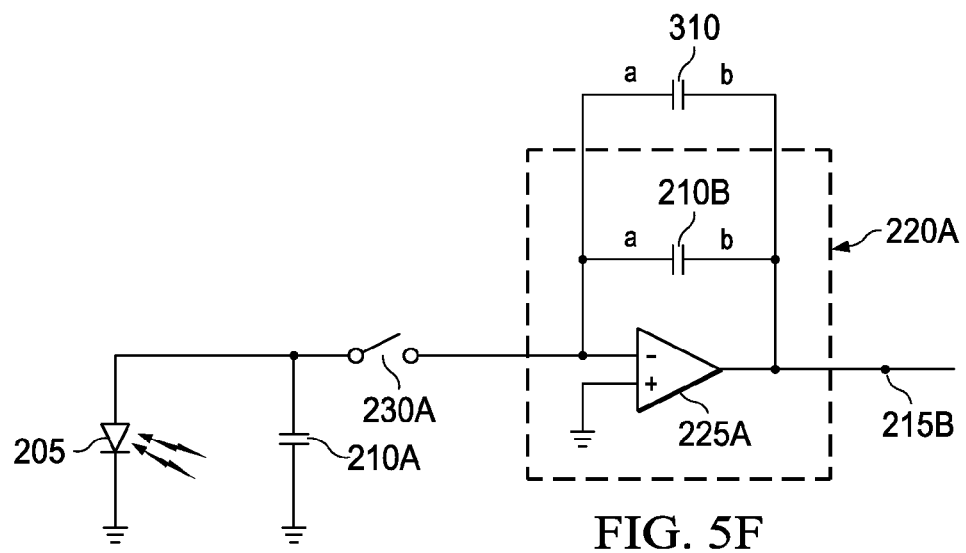

FIG. 5F illustrates connections of the capacitor 210B and the capacitor 310 in the conversion time interval 520. The capacitor 210B and the capacitor 310 are coupled in parallel to each other and in parallel to the integrator circuit 220A.

Figure 6:
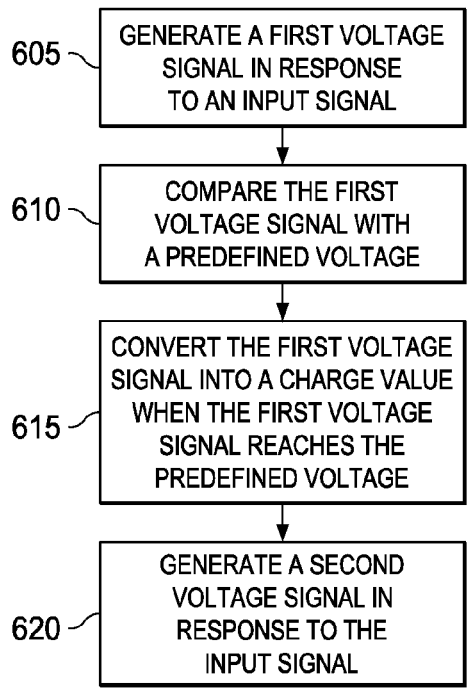
FIG. 6 is a flow diagram illustrating a method for obtaining charge value from an input signal in accordance with one embodiment.

FIG. 6 is a flow diagram illustrating a method for obtaining a charge value from an input signal.

At step 605, a first voltage signal is generated in response to an input signal. The input signal can be received in form of an incident beam. A current signal is generated from the input signal. The current signal is integrated to generate the first voltage signal. The integration can be performed, for example, by using an integrator circuit.

At step 610, the first voltage signal is compared with a predefined voltage. The comparison can be performed, for example, by using a comparator.

At step 615, the first voltage signal is converted into the charge value when the first voltage signal reaches the predefined voltage. The charge value is in digital format and is representative of digital data. The charge value can be generated, for example, by using a CTSD modulator.

At step 620, a second voltage signal is generated in response to the input signal. The second voltage signal is generated from the current signal, for example, by using another integrator circuit.

In some embodiments, step 615 and step 620 are performed simultaneously.

Step 605 to step 620 can be repeated till entire input signal is converted into charge values. The input signal including the analog data is converted into the charge values representative of the digital data.

Figure 7:
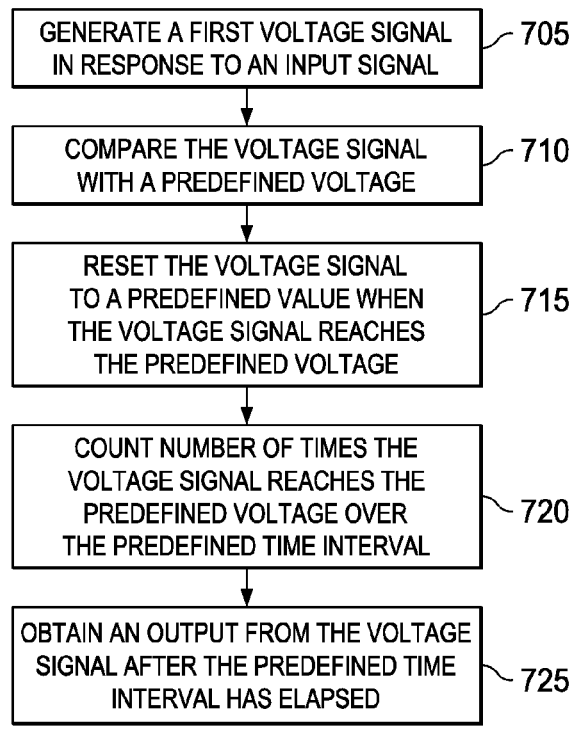
FIG. 7 is a flow diagram illustrating a method for obtaining charge value from an input signal in accordance with another embodiment.

FIG. 7 is a flow diagram illustrating a method for obtaining an output from an input signal.

At step 705, a voltage signal is generated in response to an input signal. The input signal can be received in form of an incident beam. A current signal is generated from the input signal. The current signal is integrated to generate the voltage signal. The integration is performed by discharging a capacitor.

At step 710, the voltage signal is compared with a predefined voltage.

At step 715, the voltage signal is reset to a predefined value when the voltage signal reaches the predefined voltage. The predefined value is modulus of the predefined voltage. The voltage signal can be reset, for example, by disconnecting the capacitor and connecting another charged capacitor. A leftover charge in the capacitor is stored and can be referred to as the stored charge.

Step 705 to step 715 are performed until a predefined time interval has elapsed.

At step 720, number of times the voltage signal reaches the predefined voltage over the predefined time interval is counted.

At step 725, the output is obtained from the voltage signal after the predefined time interval has elapsed. For example, for each count a charge value can be determined as 2*VREF*C. If the count is seven then the first charge value can be determined as 7*2*VREF*C.

In some embodiments, it might happen that the predefined time interval elapses after the last count but before the output voltage signal reaches the predefined voltage. In such a case the voltage signal generated during a partial count is also converted into a charge value and considered to calculate a second charge value. Calculating the second charge value also includes adding the stored charge to the second charge value. The first charge value and the second charge value are summed to yield total charge. A digital equivalent of the total charge is outputted. The digital equivalent represents the digital data.

Figure 8:
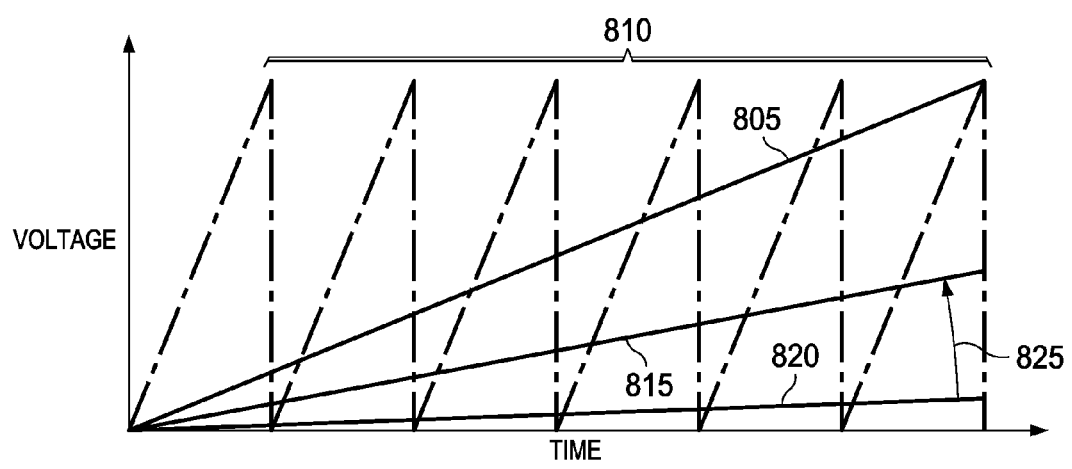
FIG. 8 is a graphical representation of an output voltage signal of an integrator circuit in accordance with one embodiment.

FIG. 8 is a graphical representation of an output voltage signal of an integrator circuit, for example the integrator circuit 220A. The Y-axis represents the output voltage signal and the X-axis represents the predefined time interval (60 ms). The predefined time interval is divided into six integration phases. Each integration phase is of 10 ms. A waveform 805 indicates the high output voltage signal for high current in accordance with prior art. One or more waveforms 810 indicate the high output voltage signals for high current generated in each integration phase. A waveform 820 indicates a low output voltage signal in accordance with the prior art. A waveform 815 indicates a low output voltage signal. The difference between the waveform 815 and the waveform 820 is indicated by a curve 825.

Due to high capacitance value of the feedback capacitor in the prior art, the noise is high and hence magnitude of the waveform 820 is less. Having a low capacitance value for the feedback capacitor, for example the capacitor 210B, the noise is reduced and the low output voltage signal can be realized in a better way as indicated by the waveform 815. The high output voltage signal is also achieved, for example by using the comparator 245 as indicated by the one or more waveforms 810.

In the foregoing discussion, the term "coupled or coupled" refers to either a direct electrical connection between the devices coupled or an indirect connection through intermediary devices. The term "circuit" means at least either a single component or a multiplicity of components, that are coupled together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A circuit comprising:
   a generating circuit that generates a current signal in response to an input signal;
   a plurality of integrators coupled to the generating circuit, a first one of the plurality of integrators responsive to the current signal to generate a voltage signal;
   a comparator responsive to the voltage signal and at least one input to generate a comparator output;
   a first switching circuit, coupled to the comparator, that inactivates the first one of the plurality of integrators and activates a second one of the plurality of integrators based on the comparator output; and
   an analog-to-digital converter, coupled to the plurality of integrators that generates an output from the voltage signal.

2. The circuit as claimed in claim 1, wherein the comparator is responsive to a first input of the at least one input and to the voltage signal to generate the comparator output indicating that the voltage signal has reached a predefined voltage.

3. The circuit as claimed in claim 1, wherein the comparator is responsive to a second input of the at least one input to generate the comparator output indicating that a predefined time has elapsed.

4. The circuit as claimed in claim 1, wherein the analog-to-digital converter is a continuous time sigma delta analog-to-digital converter.

5. The circuit as claimed in claim 1 and further comprising:
   a second switching circuit coupled to the analog-to-digital converter and responsive the comparator output, to provide the voltage signal to the analog-to-digital converter selectively.

6. The circuit as claimed in claim 1, wherein the first one of the plurality of integrators comprises a first capacitor.

7. The circuit as claimed in claim 6 and further comprising:
   a second capacitor, coupled to the first one of the plurality of integrators that discharges the first capacitor when the voltage signal reaches a predefined voltage.

8. The circuit as claimed in claim 7 and further comprising:
   a third switching circuit, coupled to the first capacitor and the second capacitor, that reconfigures the first capacitor and the second capacitor to discharge the first capacitor when the voltage signal reaches the predefined voltage and to enable the second capacitor to generate the voltage signal in response to the current signal.

9. The circuit as claimed in claim 7 and further comprising:
   a counter coupled to the comparator that counts number of times the voltage signal, generated by the first one of the plurality of integrators, reaches the predefined voltage in a predefined time interval.

10. The circuit as claimed in claim 9 and further comprising:
    a summer, coupled to the counter and to the analog-to-digital converter, to sum a first charge value corresponding to the count and a second charge value from the analog-to-digital converter, the sum being the output.

11. The circuit as claimed in claim 1, wherein the circuit is comprised in an analog front end of a computed tomography system.

12. A method comprising:
    generating a voltage signal in response to an input signal;
    comparing the voltage signal with a predefined voltage;
    resetting the voltage signal when the voltage signal reaches a predefined voltage; wherein resetting comprises disconnecting a capacitor generating the voltage signal and connecting another charged capacitor at place of the capacitor;
    counting number of times the voltage signal reaches the predefined voltage over a predefined time interval; and
    obtaining an output from the voltage signal after the predefined time interval has elapsed.

13. The method as claimed in claim 12, wherein the generating comprises:
    discharging the capacitor.

14. The method as claimed in claim 13 and further comprising:
    determining leftover charge in the capacitor when the voltage signal reaches the predefined voltage; and
    storing the leftover charge in each count.

15. The method as claimed in claim 14 and further comprising:
    adding stored charge to the output.

16. The method as claimed in claim 12, wherein the obtaining comprises:
    determining a first charge value corresponding to count of the number of times the voltage signal reaches the predefined voltage over the predefined time interval.

17. The method as claimed in claim 12, wherein the obtaining comprises:
    obtaining a second charge value from a partial count in which the voltage signal does not reach the predefined voltage, wherein the partial count occurs subsequent to a last count in which the voltage signal reaches the predefined voltage.

* * * * *